United States Patent [19]
Van Der Wel et al.

[11] Patent Number: 5,508,213
[45] Date of Patent: Apr. 16, 1996

[54] METHOD OF MANUFACTURING A SEMICONDUCTOR DEVICE IN WHICH A SEMICONDUCTOR ZONE IS FORMED THROUGH DIFFUSION FROM A STRIP OF POLYCRYSTALLINE SILICON

[75] Inventors: Willem Van Der Wel; Alexander C. L. Jansen; Ronald Koster, all of Eindhoven, Netherlands

[73] Assignee: U.S. Philips Corporation, New York, N.Y.

[21] Appl. No.: 326,440

[22] Filed: Oct. 20, 1994

[30] Foreign Application Priority Data

Oct. 25, 1993 [BE] Belgium ............... 09301135

[51] Int. Cl.⁶ ........................... H01L 21/265
[52] U.S. Cl. ............. 437/31; 437/162; 437/59; 437/34; 437/233; 148/DIG. 9
[58] Field of Search ............. 437/31, 34, 59, 437/162, 161, 228, 233; 148/DIG. 9

[56] References Cited

U.S. PATENT DOCUMENTS

| | | | |
|---|---|---|---|
| 4,987,089 | 1/1991 | Roberts | 437/34 |
| 5,244,533 | 9/1993 | Kimura et al. | 437/31 |

FOREIGN PATENT DOCUMENTS

0493853  7/1992  European Pat. Off. .

*Primary Examiner*—Tuan H. Nguyen
*Attorney, Agent, or Firm*—Steven R. Biren

[57] ABSTRACT

A method of manufacturing a semiconductor device whereby on a surface (3) of a semiconductor body (1) a conductor track (21) of polycrystalline silicon insulated from the surface (3) is provided in a layer of doped polycrystalline silicon (11) provided on a layer of insulating material (10), and whereby a strip of polycrystalline silicon (19, 35) is formed between an edge (18) of the conductor (21) and a portion (24, 34) of the surface (3) adjoining the edge (18), after which a semiconductor zone (30) is formed through diffusion of dopant from the conductor (21) through the strip (19, 35) into the semiconductor body (1). During the formation of the insulated conductor (21) and the strip of polycrystalline silicon (19, 35), a window (15) is etched into the layer of polycrystalline silicon (11) by means of a first etching mask (13), after which the insulating layer (10) is removed from the surface (3) within the window (15), the window (15) is provided at its edge (18) with a strip of polycrystalline silicon (19, 35), and the conductor (21) is etched into the layer of polycrystalline silicon (11) by means of a second etching mask (20), this second etching mask (20) covering at least a portion of the edge (18) of the window (15). Further conductors (22, 23) may be formed in the polycrystalline layer (11) next to the insulated conductor (21), all conductors (21, 22, 23) being given dimensions such as defined by the second etching mask (20).

6 Claims, 6 Drawing Sheets

METHOD OF MANUFACTURING A SEMICONDUCTOR DEVICE IN WHICH A SEMICONDUCTOR ZONE IS FORMED THROUGH DIFFUSION FROM A STRIP OF POLYCRYSTALLINE SILICON

BACKGROUND OF THE INVENTION

The invention relates to a method of manufacturing a semiconductor device whereby on a surface of a semiconductor body a conductor track of polycrystalline silicon insulated from the surface is formed in a layer of doped polycrystalline silicon provided on a layer of insulating material, and whereby a strip of polycrystalline silicon is formed between an edge of the conductor and a portion of the surface adjoining the edge, after which a semiconductor zone is formed in the semiconductor body through diffusion of dopant from the conductor through the strip.

A strip of polycrystalline silicon with a very small width of, for example, less than 100 nm may be provided between the edge of the insulated conductor and the portion of the surface adjoining this edge. The semiconductor zone formed through diffusion will accordingly be very narrow, having a width of approximately 150 nm. The method may be used, for example, for the manufacture of a bipolar transistor with a very narrow emitter zone, also called ribbon emitter, which is suitable for the amplification of very high-frequency signals.

In practice, the method is particularly suitable for the manufacture of integrated circuits which comprise besides bipolar transistors having a very narrow emitter zone also other semiconductor elements such as field effect transistors. Besides a pattern of conductors from which the narrow semiconductor zones are formed, accordingly, a pattern of conductors may be provided in the layer of polycrystalline silicon which comprises, for example, gate electrodes of field effect transistors.

European Patent Application EP-A-493,853 discloses a method of the kind mentioned in the opening paragraph whereby the conductor is etched into the layer of doped polycrystalline silicon by means of a first etching mask during the formation of the insulated conductor and the strip of polycrystalline silicon. Then the layer of insulating material is etched away next to the edge of the conductor from the surface of the semiconductor body by means of a second etching mask at the area of the semiconductor zone to be formed. Finally, the conductor is provided along its entire edge with the strip of polycrystalline silicon. Wherever the surface is exposed, the strip of polycrystalline silicon is then present between the edge of the conductor and the portion of the surface adjoining this edge. The semiconductor zone will be formed there during a subsequent heat treatment.

When the known method is used in the manufacture of semiconductor devices comprising besides bipolar transistors also field effect transistors, not only the insulated conductors from which the semiconductor zones are formed but also all further conductors are provided in the layer of polycrystalline silicon by means of the first etching mask. During the provision of the strip of polycrystalline silicon, such a strip is accordingly formed not only at the area of the semiconductor zone to be formed at the edge of the conductor, but along all edges of all conductors. As a result, wider conductors are created in the known method wherever this strip is provided along the edges of the conductors. Conductors are formed by the known method with a width which differs from the width as defined by in the etching mask used for etching these conductors into the layer of polycrystalline silicon. This deviation, which may be approximately 0.1 μm on either side of the conductors, so 0.2 μm in total, is inadmissible in the manufacture of semiconductor devices with a high packing density where the conductors are, for example, less than 0.5 μm wide.

SUMMARY OF THE INVENTION

The invention has for its object inter alia to improve the method mentioned in the opening paragraph to such an extent that, when it is used for the manufacture of semiconductor devices which comprise not only bipolar transistors but also field effect transistors, all conductors to be provided in the layer of polycrystalline silicon can be formed in this layer by means of a single etching mask to a width which corresponds to the width as defined by this etching mask.

According to the invention, the method mentioned in the opening paragraph is for this purpose characterized in that a window is etched into the layer of polycrystalline silicon by means of a first etching mask during the formation of the insulated conductor and the strip of polycrystalline silicon, after which the insulating layer is removed from the surface within the window, the window is provided at its edge with a strip of polycrystalline silicon, and the conductor is etched into the layer of polycrystalline silicon by means of a second etching mask, with the second etching mask covering at least a portion of the edge of the window.

During etching of the conductor, the second etching mask covers at least a portion of the edge of the window. The conductor therefore is in contact with this edge through self-alignment. Furthermore, the conductor is not etched into the layer of polycrystalline silicon until after the strip of polycrystalline silicon has been formed at the edge of the window. The window is provided in the layer of polycrystalline silicon where the semiconductor zone is to be formed in the surface, whereas the layer of polycrystalline silicon is still fully intact where the conductor is to be formed. When the method is used for the manufacture of semiconductor devices comprising not only bipolar transistors but also field effect transistors, all conductors are formed in locations where the layer of polycrystalline silicon is still fully intact. As a result, the conductors formed have a width after etching which corresponds to the width as defined by the second etching mask.

A preferred embodiment of the method is characterized in that the layer of polycrystalline silicon is provided on an insulating layer formed on a surface of the semiconductor body to which field insulation regions adjoin, while the window is provided both above a field insulation region and above an active region bounded by said field insulation region. A portion of the edge of the window, and thus also the strip of polycrystalline silicon, is then above the field insulation region. During etching of the conductor, the second mask may then be so provided that only a portion of the strip of polycrystalline silicon present above the field insulation region is etched away, while the active region is fully covered by said mask. The field insulation region thus acts as an etching stopper during etching of the layer of polycrystalline silicon. During the diffusion process, a narrow semiconductor zone is then formed which is bounded in its longitudinal direction by a field insulation region.

The window may be provided with the strip of polycrystalline silicon at its edge in a simple manner through deposition of an auxiliary layer of polycrystalline silicon after the window has been formed in the layer of polycrystalline silicon and after the insulating layer has been removed from the surface inside the window, and by subjecting the auxiliary layer to a subsequent anisotropic etching treatment until the surface of the semiconductor body inside the window has been exposed again. A strip of polycrystalline silicon is formed thereby which is situated next to the edge of the window. The auxiliary layer of polycrystalline silicon may be deposited with an accurately defined thickness. Since the strip formed by this method is given a dimension transverse to the edge of the conductor, i.e. a width, which is practically equal to the thickness of the auxiliary layer of polycrystalline silicon, a semiconductor zone with an accurately defined width is formed during the diffusion.

Alternatively, the window may be provided with the strip of polycrystalline silicon at its edge in that the layer of insulating material is etched away isotropically from the surface from a track situated below the edge of the window after the window has been formed in the layer of polycrystalline silicon and after the insulating layer has been removed from the surface inside the window, in that then an auxiliary layer of polycrystaline silicon is deposited, and in that the latter is subsequently subjected to an isotropic etching treatment until the surface of the semiconductor body inside the window has been exposed again. A strip of polycrystalline silicon is formed thereby which is situated below the edge of the conductor. During diffusion, dopant is supplied from the conductor over the full width of the strip, so that a semiconductor zone is formed which has a homogeneous doping concentration throughout its width.

BRIEF DESCRIPTION OF THE DRAWING

The invention will be explained below in more detail by way of example with reference to a drawing, in which FIGS. 1a, 1b, 1c, 2, 3a, 3b, 4a, 4b, 5a, 5b, and 6 diagrammatically and not true to scale show a number of stages in the manufacture of a first embodiment of a semiconductor device, both in cross-section and in plan view, manufactured by the method according to the invention, and FIGS. 7, 8 and 9 diagrammatically and not true to scale show a number of stages in the manufacture of a second embodiment of a semiconductor device, shown in cross-section, manufactured by the method according to the invention.

DESCRIPTION OF THE PREFERRED EMBODIMENTS

Figure 1A:
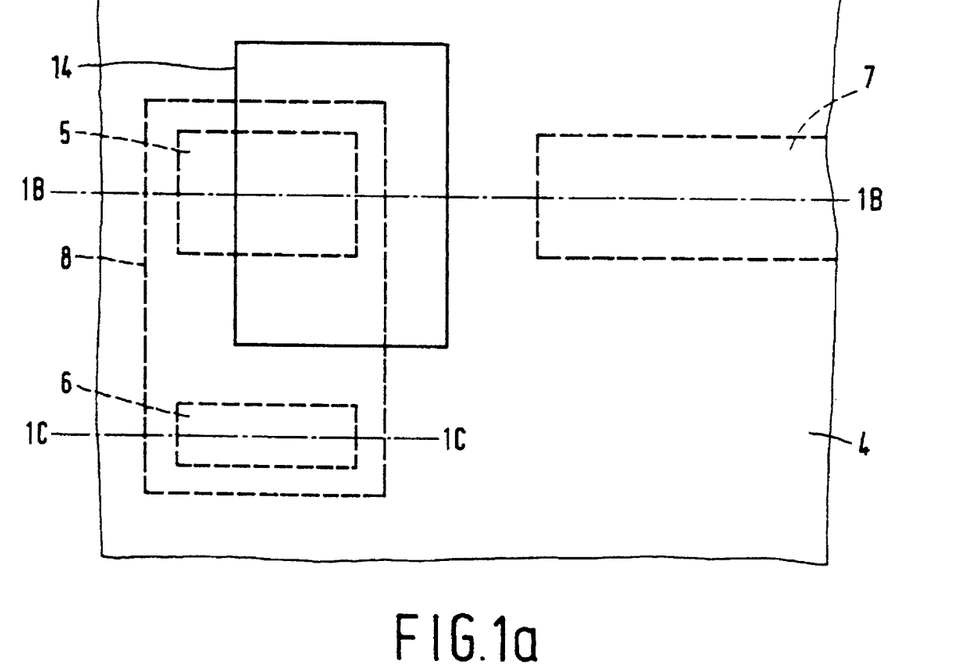
Figure 1B:
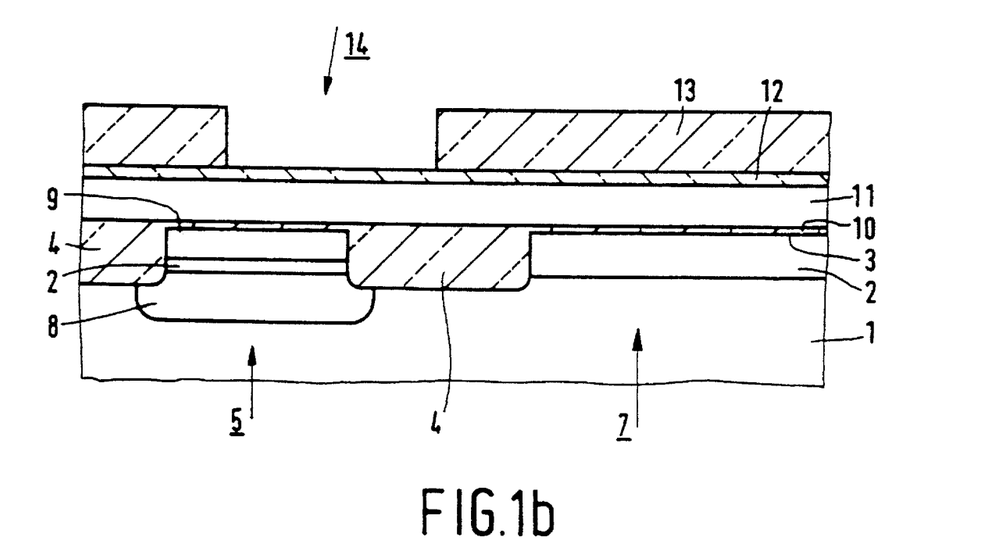
Figure 1C:
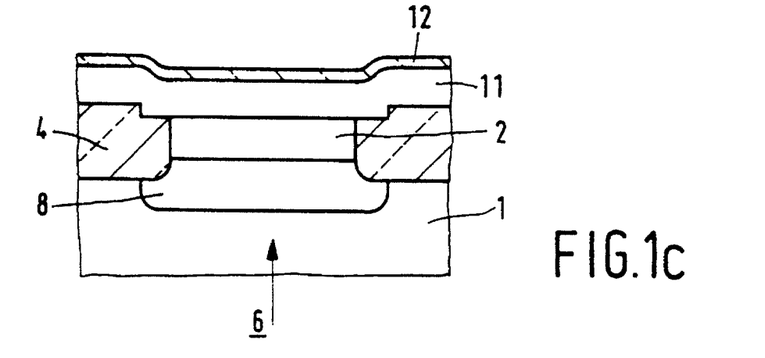

FIGS. 1 to 6 diagrammatically and not true to scale show a several stages in the manufacture of a first embodiment of a semiconductor device, both in cross-section and in plan view, manufactured by the method according to the invention. FIG. 1 shows a first stage, FIG. 1a being the plan view and FIGS. 1b and 1c cross-sections taken on the lines 1B—1B and 1C—1C in FIG. 1a. The method starts with a semiconductor body 1 of silicon with an epitaxially grown n-type surface layer 2 with a doping concentration of approximately $10^{16}$ atoms per cc with a surface 3 to which a field insulation region 4 of silicon oxide and regions 5, 6 and 7 surrounded by the former region adjoin. The active regions 5 and 6 are interconnected below the field insulation region 4 by an n-type buried layer 8 with a doping concentration of approximately $10^{19}$ atoms per cc. The active region 5 can then be contacted at its lower side via the active region 6. A p-type doped layer 9 with a doping concentration of approximately $10^{18}$ atoms per cc is provided in the active region 5.

An insulating layer of silicon oxide 10 with a thickness of approximately 15 nm is formed on the surface 3 of the semiconductor body 1 by a usual thermal oxidation method. After this layer has been removed from the active region 6, as shown in FIG. 1c, an approximately 300 nm thick layer of n-type doped polycrystalline silicon 11 with a doping concentration of approximately $6\times10^{20}$ is deposited in usual manner. In addition, an approximately 50 nm thick layer of silicon nitride 12 is deposited on the layer of polycrystalline silicon 11 in the present example, although this is not necessary.

Figure 2:
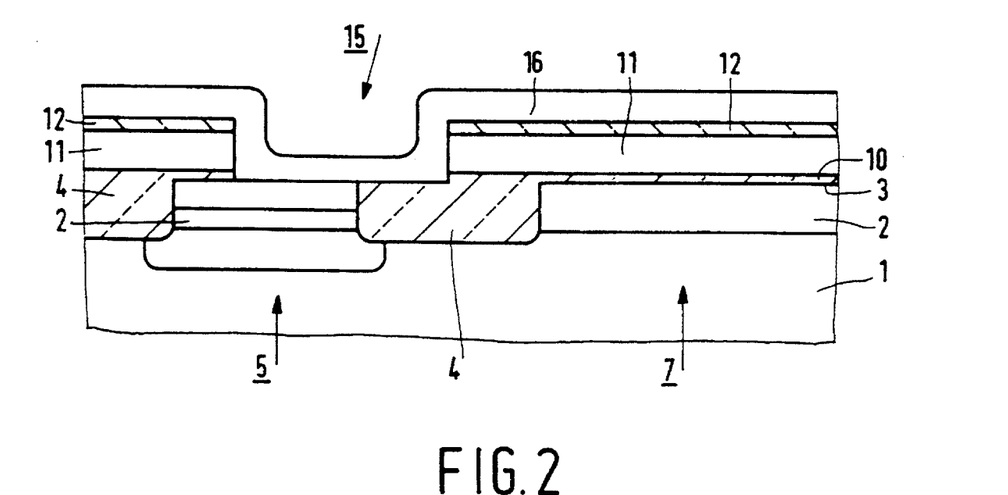

Subsequently, a first etching mask 13 of photoresist is formed on the silicon nitride layer 12 in a usual photolithographical manner, with an opening 14 within which the layer of silicon nitride 12 is exposed. A window 15 is subsequently etched into the silicon nitride layer 12 and into the polycrystalline silicon layer 11 by means of this first etching mask 13, whereby the polycrystalline silicon of the layer 11 can be selectively removed from the silicon oxide layer 10 and from the silicon oxide field insulation region 4. Then, as shown in FIG. 2, an approximately 100 nm thick auxiliary layer of polycrystalline silicon 16 is deposited in usual manner after the insulating layer 10 has been removed from the surface 3 within the window 15.

Figure 3A:
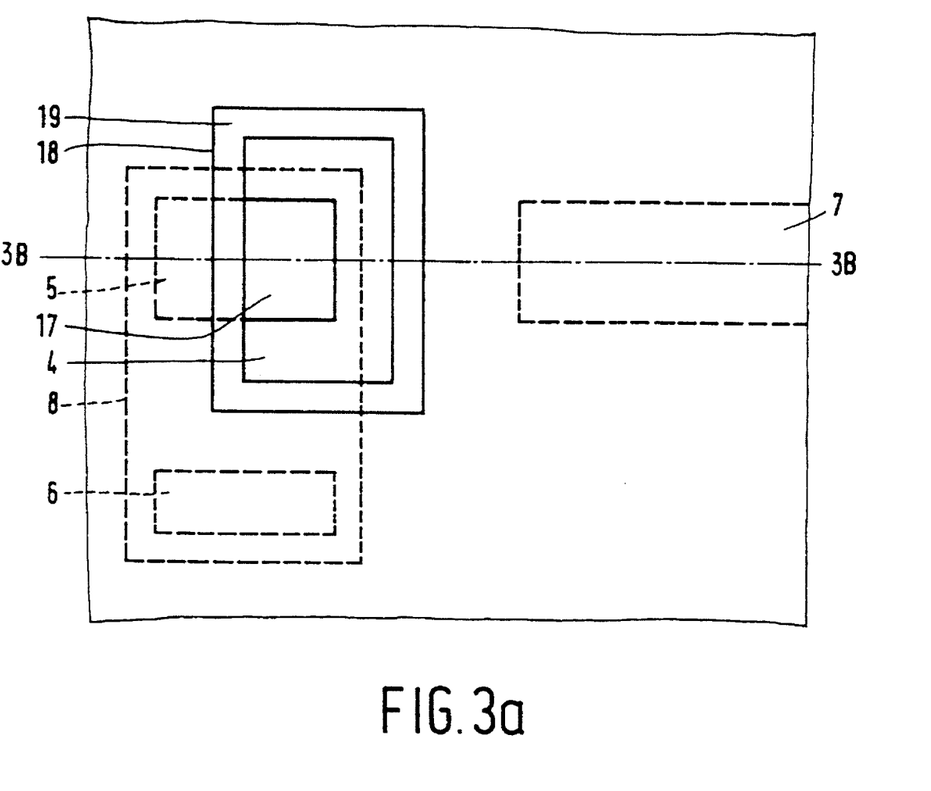
Figure 3B:
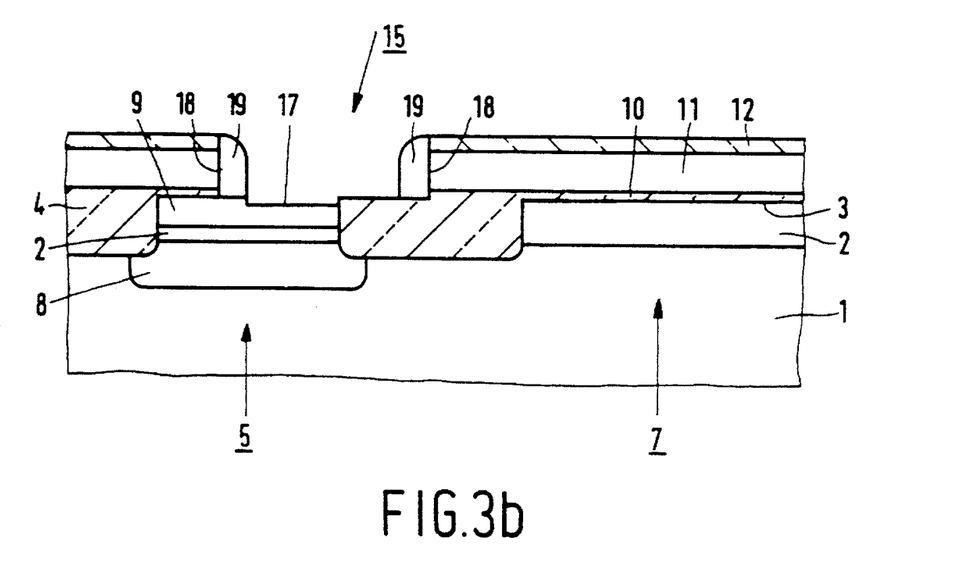

The auxiliary layer of polycrystalline silicon 16 is subsequently subjected to an anisotropic etching treatment until the surface 3 of the semiconductor body 1 has been exposed. This is done in practice through detection of the moment when the layer of silicon nitride 12 has been reached, upon which the etching treatment is continued for a given overetching period. The moment the silicon nitride layer 12 is reached, the auxiliary layer of polycrystalline silicon 16 has been etched for so long that it should indeed have been removed from the surface within the window 15 as well. It is found in practice, however, that a little polycrystalline silicon may have been left behind in the window. This is why the etching treatment is continued for some time. A slight depression may arise in the p-type top layer 9 inside the window 15 then, as shown in FIG. 3.

The process steps described, whereby an auxiliary layer of polycrystalline silicon 16 is deposited which is subsequently subjected to an anisotropic etching treatment until the surface 3 of the semiconductor body 1 is exposed again inside the window 15, provides the window 15 at its edge 18 with a strip of polycrystalline silicon 19.

Figure 4A:
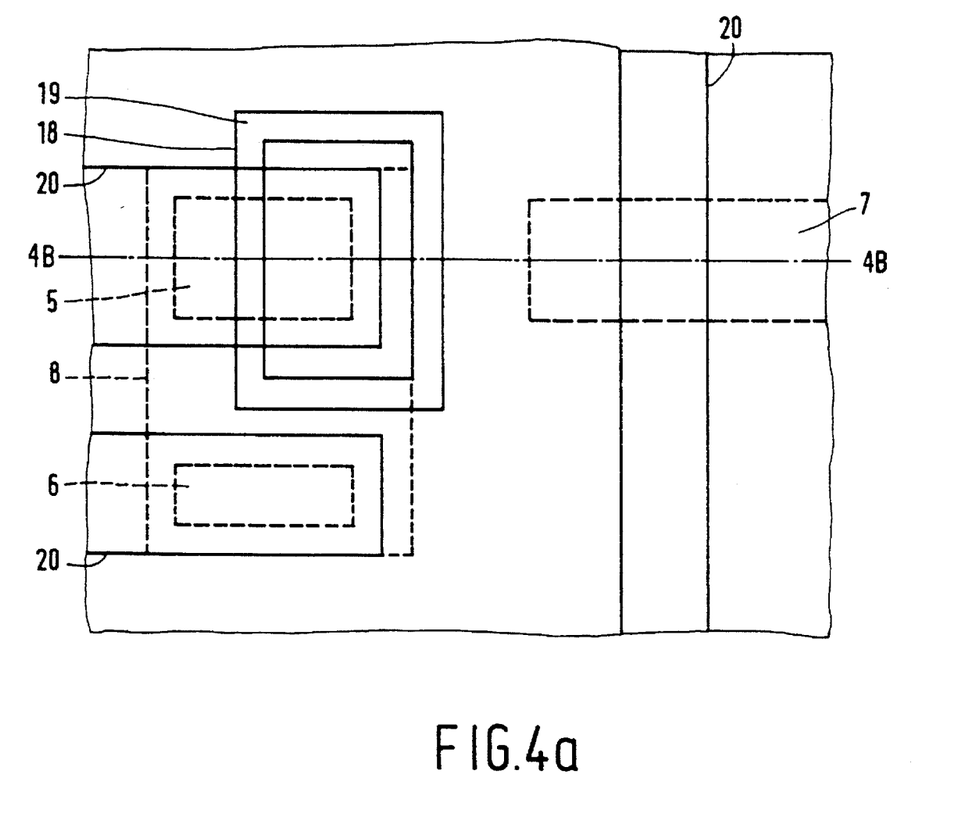
Figure 4B:
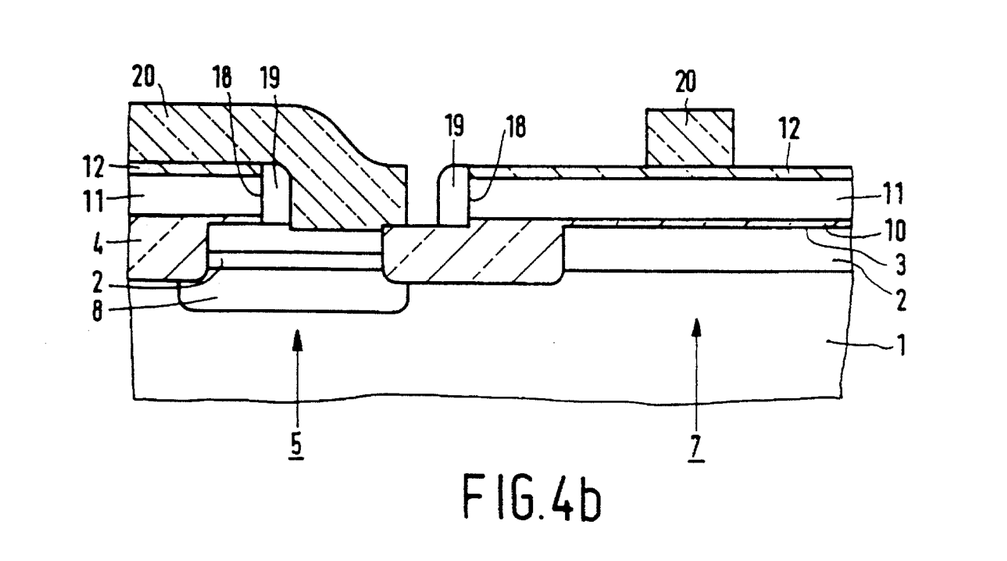
Figure 5A:
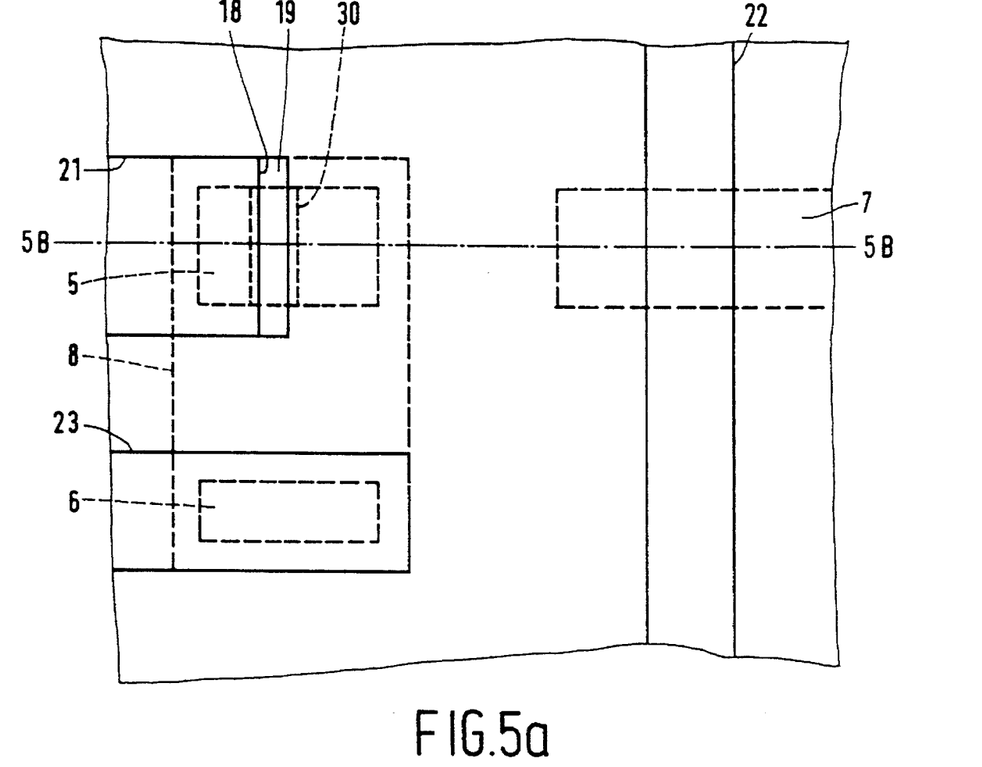
Figure 5B:
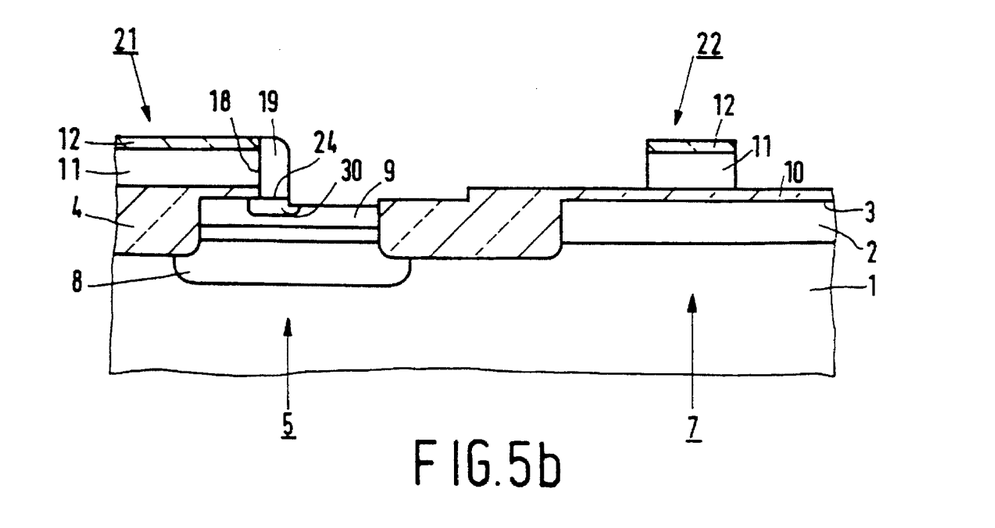

After the window 15 has been provided at its edge 18 with the strip of polycrystalline silicon 19, a second etching mask 20 of photoresist is provided in usual photolithographical manner, as is shown in FIGS. 4a and 5a in plan view and in FIGS. 4b and 5b in cross-section taken on the lines 4B—4B and 5B—5B in FIGS. 4a and 5a, respectively. A pattern of conductors 21, 22, 23 is etched into the layer of polycrystalline silicon 11 by means of this second etching mask 20. A conductor track 21 of polycrystalline silicon is thus formed on a surface 3 of a semiconductor body 1, insulated from the surface 3, in a layer of doped polycrystalline silicon 11 provided on a layer of insulating material 10. Since a portion of the edge 18 of the window 15 is covered by the second etching mask 20 in this example, the portion of the edge 18 forms the edge of the conductor 21. The strip of polycrystalline silicon 19 is present between the edge 18 of the conductor 21 and a portion 24 of the surface 3 adjoining the edge 18. Subsequently, a semiconductor zone 30 with a width of approximately 150 nm and a doping concentration of approximately $2\times10^{20}$ atoms per cc is formed in the p-type top layer 9 of the semiconductor body 1 through diffusion of dopant from the conductor 21 through the strip 19 by means of a usual heat treatment.

Figure 6:
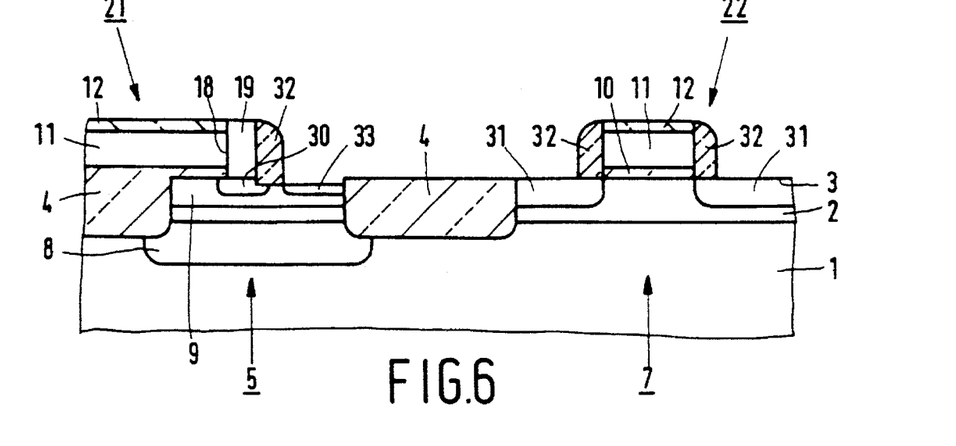

After the formation of the semiconductor zone 30, furthermore, as shown in cross-section in FIG. 6, the silicon oxide layer 10 is removed from the surface next to the conductor 22, p-type semiconductor zones 31 are formed next to the conductor 22, and the conductors 21, 22 and 23 are provided with spacers 32. These spacers 32 are formed in a manner analogous to that in which the strip 19 was formed at the edge 18 of the window 15. Subsequently, a p-type semiconductor zone 33 with a doping concentration of approximately $10^{20}$ atoms per cc is formed, which facilitates contacting of the top layer 9.

A bipolar transistor and a field effect transistor have thus been formed in the semiconductor body. The bipolar transistor comprises an emitter zone formed by the semiconductor zone 30 contacted by the conductor 21, a base zone formed by the top layer 9 and contacted through the semiconductor zone 33, and a collector zone formed by the portion of the epitaxially grown layer 2 situated within the active region 5 and contacted by the buried layer 8 and the conductor 23. The field effect transistor comprises a source zone and a drain zone formed by the semiconductor zones 31, a channel zone formed by the portion of the epitaxially grown layer 2 situated in the active region 7 and between the semiconductor zones 31, and a gate electrode formed by the conductor 22.

A strip of polycrystalline silicon 19 with a very small width, such as 100 nm in the present example, may be provided between the edge 18 of the insulated conductor 21 and the portion of the surface 3 which adjoins this edge 18. The semiconductor zone 30 formed through diffusion has a width of approximately 150 mm. The method may be used, as in the present example, for manufacturing a bipolar transistor with a very narrow emitter zone, also called ribbon emitter, which is suitable for amplifying very high-frequency signals.

Figure 7:
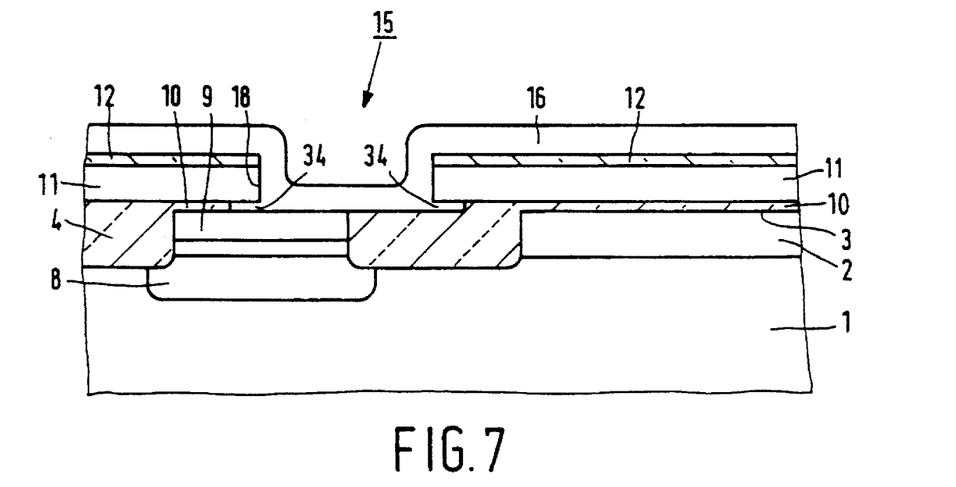
Figure 8:
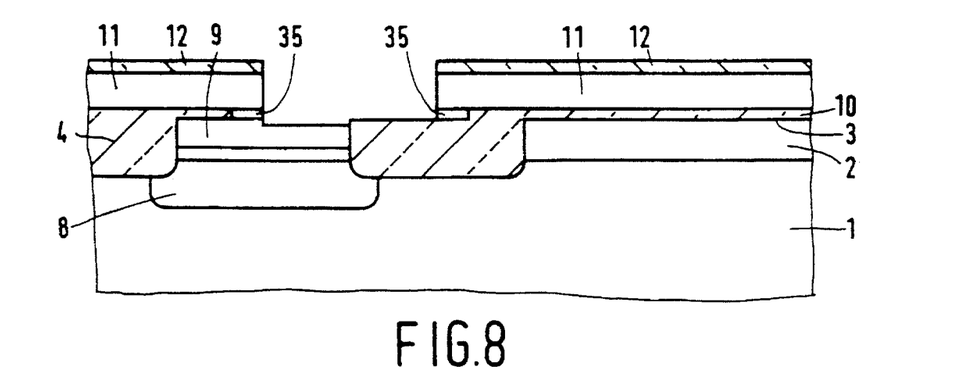
Figure 9:
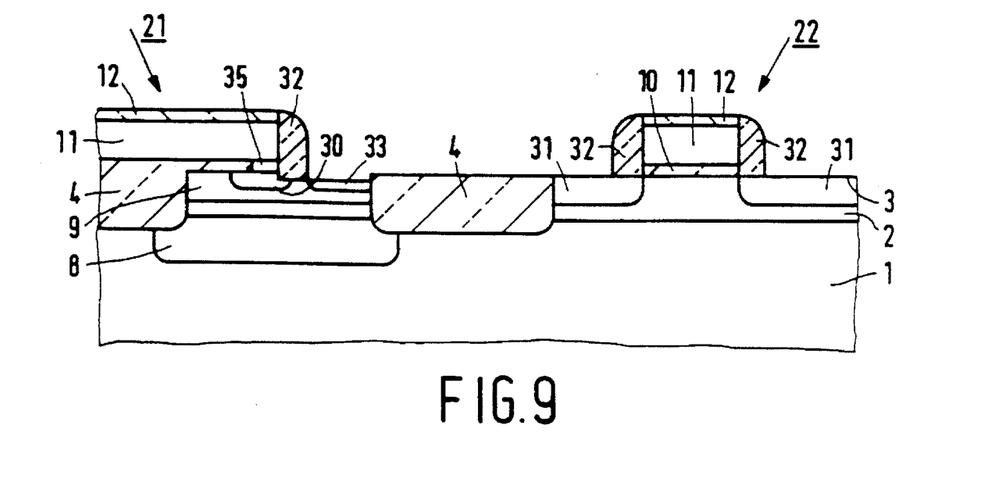

FIGS. 7 to 9 diagrammatically and in cross-section, not true to scale, show a few stages in the manufacture of a second embodiment of a semiconductor device, where the window 15 is provided with a strip of polycrystalline silicon at its edge 18 in a manner different from the one described above. After the window 15 has been etched into the silicon nitride layer 12 and into the polycrystalline silicon layer 11, and after the surface 3 has been exposed in the window 15, in this case the layer of insulating material 10 is etched away isotropically from the surface 3 in a track 34 situated below the edge 18 of the window 15. Then an auxiliary layer 16 of polycrystalline silicon is deposited which is subsequently subjected to an isotropic etching treatment until the surface of the semiconductor body 3 within the window 15 has been exposed again. The window 15 is thus provided at its edge 18 with the strip of polycrystalline silicon 35. Finally, in the same manner as above, the bipolar transistor and field effect transistor shown in FIG. 9 are formed in the semiconductor body 1.

In both examples given above, the second etching mask 20 covers at least a portion of the edge 18 of the window 15 during etching of the conductor 21. As a result, the conductor 21 merges into this edge 18 in a self-aligned manner. Furthermore, the conductor 21 is not formed in the layer of polycrystalline silicon 11 until after the strip of polycrystalline silicon 19, 35 has been formed at the edge 18 of the window 15. The window 15 is provided in the layer of polycrystalline silicon 11 where the semiconductor zone 30 is to be formed in the surface 3, whereas the layer of polycrystalline silicon 11 is still fully intact where the conductor 21 is to be formed. When the method is used as indicated in the examples given, all conductors 21, 22, 23 are formed in locations where the layer of polycrystalline silicon 11 is still fully intact in the manufacture of semiconductor devices which comprise not only bipolar transistors but also field effect transistors. The conductors 21, 22, 23 formed then have a width after etching which corresponds to the width as defined by the second etching mask.

In both examples, the auxiliary layer of polycrystalline silicon 16 was provided on an insulating layer 10 formed on a surface 3 of the semiconductor body 1 adjoining field insulation regions 4, and the window 15 was provided both above a field insulation region 4 and above an active region 5 bounded by that field insulation region. A portion of the edge 18 of the window 15, and thus also the strip of polycrystalline silicon 19, 35, is then situated above the field insulation region 4. The second mask 20 may then be so provided during etching of the conductor 21, as was also the case in the examples, that only a portion of the strip of polycrystalline silicon 19, 35 which is present above the field insulation region 4 is etched away, while the active region 5 is fully covered by this mask 20. The field insulation region 4 then acts as an etching stopper during etching or the auxiliary layer or polycrystalline silicon 16. A narrow semiconductor zone 30 is then formed during diffusion, which zone is limited in its longitudinal direction by the field insulation region 4, as is apparent from FIG. 5a.

In the first example, the window 15 was provided at its edge 18 with the strip of polycrystalline silicon 19 in that an auxiliary layer of polycrystalline silicon 16 was deposited after the window 15 had been etched and the surface within the window 15 had been exposed, and in that this auxiliary layer was subsequently subjected to an anisotropic etching treatment until the surface 3 of the semiconductor body 1 was exposed again within the window 15. A strip of polycrystalline silicon 19 is formed thereby which is situated next to the edge 18 of the window 15. The auxiliary layer of polycrystalline silicon can be deposited to an accurately defined thickness. Since the strip 19 formed by this method is given a dimension transverse to the edge 18 of the conductor 21, i.e. a width, which is practically equal to the thickness of the deposited auxiliary layer of polycrystalline silicon 16, a semiconductor zone 30 with an accurately defined width is formed during the diffusion.

In the second example, the window 15 was provided at its edge 18 with the strip of polycrystalline silicon 35 in that the layer of insulating material 10 was etched away isotropically from the surface 3 over a track 34 situated below the edge 18 of the window 15 after the window 15 had been etched and the surface within the window 15 had been exposed, in that subsequently the auxiliary layer of polycrystalline silicon 16 was deposited, and in that the latter was then subjected to an isotropic etching treatment until the surface 3 within the window was exposed again. In this case a strip of polycrystalline silicon 35 is formed which is situated below the edge 18 of the conductor 21. Dopant is supplied from the conductor over the entire width of the strip 35 during the diffusion, so that a semiconductor zone 30 is formed which has a homogeneous doping concentration throughout its width.

In the examples given, the second etching mask 20 covered the edge 18 of the window 15 only partly, while the window 15 also extended both over an active region 5 and over a field insulation region 4. The second etching mask 20, however, could alternatively be so provided that it covered the entire window 15, in which case the entire strip 19 would be circumferentially connected to the conductor 21. If in addition the window 15 extended over an active region only, then a semiconductor zone circumferentially connected to the conductor 21 would be formed from the entire strip.

We claim:

1. A method of manufacturing a semiconductor device whereby on a surface of a semiconductor body a conductor track of polycrystalline silicon insulated from the surface is formed in a layer of doped polycrystalline silicon provided on a layer of insulating material, and whereby a strip of polycrystalline silicon is formed between an edge of the conductor and a portion of the surface adjoining said edge, after which a semiconductor zone is formed in the semiconductor body through diffusion of dopant from the conductor through the strip, characterized in that a window is etched into the layer of polycrystalline silicon by means of a first etching mask after which the insulating layer is removed from the surface within said window, the window is provided at its edge with a strip of polycrystalline silicon, and the conductor track is formed in the layer of polycrystalline silicon by means of a second etching mask with said second etching mask covering at least a portion of the edge of the window.

2. A method as claimed in claim 1, characterized in that the layer of polycrystalline silicon is provided on an insulating layer formed on a surface of the semiconductor body to which field insulation regions adjoin, while the window is provided both above a field insulation region and above an active region bounded by said field insulation region.

3. A method as claimed in claim 2, characterized in that the window is provided at its edge with the strip of polycrystalline silicon through deposition of an auxiliary layer of polycrystalline silicon and by subjecting said auxiliary layer to a subsequent anisotropic etching treatment until the surface of the semiconductor body inside the window has been exposed again.

4. A method as claimed in claim 2, characterized in that the window is provided at its edge with the strip of polycrystalline silicon in that the layer of insulating material is etched away isotropically from the surface in a track situated below the edge of the window, in that then an auxiliary layer of polycrystaline silicon is deposited, and in that the auxiliary layer is subsequently subjected to an isotropic etching treatment until the surface of the semiconductor body inside the window has been exposed again.

5. A method as claimed in claim 1, characterized in that the window is provided at its edge with the strip of polycrystalline silicon through deposition of an auxiliary layer of polycrystalline silicon and by subjecting said auxiliary layer to a subsequent anisotropic etching treatment until the surface of the semiconductor body inside the window has been exposed again.

6. A method as claimed in claim 1, characterized in that the window is provided at its edge with the strip of polycrystalline silicon, in that the layer of insulating material is etched away isoptropically from the surface in a track situated below the edge of the window, in that then an auxiliary layer of polycrystalline silicon is deposited, and in that the auxiliary layer is subsequently subjected to an isotropic etching treatment until the surface of the semiconductor body inside the window has been exposed again.

\* \* \* \* \*